(12) United States Patent
Kraus et al.

(10) Patent No.: US 11,109,455 B2
(45) Date of Patent: Aug. 31, 2021

(54) AUTOMATIC TRIMMING FOR A DIMMER SWITCH

(71) Applicant: Hubbell Incorporated, Shelton, CT (US)

(72) Inventors: Nicholas Charles Kraus, Enfield, CT (US); Michael Dennis Tetreault, Simsbury, CT (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 16/656,765

(22) Filed: Oct. 18, 2019

(65) Prior Publication Data

US 2020/0187318 A1    Jun. 11, 2020

Related U.S. Application Data

(60) Provisional application No. 62/776,553, filed on Dec. 7, 2018.

(51) Int. Cl.
*H05B 45/10* (2020.01)
*G01R 21/01* (2006.01)

(52) U.S. Cl.
CPC ............. *H05B 45/10* (2020.01); *G01R 21/01* (2013.01)

(58) Field of Classification Search
CPC ......... H05B 45/10; H05B 45/24; G01R 21/01
See application file for complete search history.

(56) References Cited

U.S. PATENT DOCUMENTS

| | | | |
|---|---|---|---|
| 8,461,503 B2 | 6/2013 | Leinen | |
| 8,890,418 B2 | 11/2014 | Mohan et al. | |
| 9,474,121 B2 * | 10/2016 | Shaffer | H05B 45/10 |
| 9,713,231 B2 | 7/2017 | Kelly et al. | |
| 2007/0170873 A1 * | 7/2007 | Mishima | H05B 41/2886 |
| | | | 315/291 |
| 2007/0285027 A1 | 12/2007 | Gehman | |
| 2011/0080046 A1 | 4/2011 | Lee et al. | |

(Continued)

FOREIGN PATENT DOCUMENTS

| | | |
|---|---|---|
| JP | 2016-73003 | 5/2016 |
| WO | WO 2016/073272 | 5/2016 |

OTHER PUBLICATIONS

PCT International Search Report and Written Opinion for corresponding PCT Application No. PCT/US19/56893, dated Jan. 10, 2020, 8 pages.

(Continued)

*Primary Examiner* — Renan Luque
(74) *Attorney, Agent, or Firm* — Michael Best & Friedrich LLP

(57) ABSTRACT

A dimmer switch includes a dimmer circuit configured to output a dimming control signal to control one or more dimmable light sources of a lighting fixture. The dimmer switch includes a power metering circuit configured to monitor power consumption of the one or more dimmable light source. The dimmer switch includes one or more control devices. The one or more control devices are configured to perform a test operation to determine a low-end trim setpoint for the dimming control signal. The one or more control devices are further configured to adjust a range of the dimming control signal based, at least in part, on the low-end trim setpoint.

12 Claims, 12 Drawing Sheets

(56) References Cited

U.S. PATENT DOCUMENTS

| | | |
|---|---|---|
| 2013/0038234 A1 | 2/2013 | Van Der Veen et al. |
| 2014/0103823 A1 | 4/2014 | Kahlman et al. |
| 2014/0253483 A1 | 9/2014 | Kupersztoch et al. |
| 2015/0005900 A1 | 1/2015 | Steele et al. |
| 2015/0012151 A1 | 1/2015 | Park |
| 2015/0195888 A1* | 7/2015 | Szczerba ............... H05B 41/39 315/307 |
| 2016/0088700 A1* | 3/2016 | Shaffer ................. H05B 45/14 315/200 R |
| 2016/0135265 A1* | 5/2016 | Eum ..................... H05B 45/37 315/307 |
| 2017/0164435 A1* | 6/2017 | Lee ....................... H05B 45/10 |
| 2017/0234562 A1 | 8/2017 | Ribbich et al. |
| 2017/0280523 A1* | 9/2017 | Kathiresan ........... H05B 45/382 |
| 2018/0173416 A1 | 6/2018 | Baldwin et al. |

OTHER PUBLICATIONS

Biery et al, "Controlling LEDs," Technical white paper, Lutron Electronics Co., Inc., May 2014—20 pages.

\* cited by examiner

AUTOMATIC TRIMMING FOR A DIMMER SWITCH

PRIORITY CLAIM

The present application claims the benefit of priority of U.S. Provisional App. No. 62/776,553, titled "Automatic Trimming for a Dimmer Switch," having a filing date of Dec. 7, 2018, which is incorporated by reference herein.

FIELD

The present disclosure relates generally to dimmer switches for use in lighting systems.

BACKGROUND

Dimmer switches can control the intensity (e.g., brightness) of light emitted by a dimmable light source. Example dimmer switches can output a dimming control signal to a dimmable driver circuit that outputs a driver current to power the dimmable light source. The dimmable driver circuit can adjust the driver current based on the dimming control signal to control the intensity of light emitted by the dimmable light source. Example dimmable light sources (e.g., light emitting diode devices) may not turn on and/or may flicker at a lower-end of a dimming range associated with the dimmable light sources.

SUMMARY

Aspects and advantages of embodiments of the present disclosure will be set forth in part in the following description, or may be learned from the description, or may be learned through practice of the embodiments.

One example aspect of the present disclosure is directed to a dimmer switch. The dimmer switch includes a dimmer circuit configured to output a dimming control signal to control one or more dimmable light sources of a lighting fixture. The dimmer switch includes a power metering circuit configured to monitor power consumption of the one or more dimmable light sources. The dimmer switch includes one or more control devices configured to perform a test operation to determine a low-end trim setpoint for the dimming control signal. The one or more control devices can be further configured to adjust a range of the dimming control signal based, at least in part, on the low-end trim setpoint.

Another example aspect of the present disclosure is directed to a method for determining a low-end trim setpoint for a dimming control signal a dimmer switch outputs to control one or more dimmable light sources of a lighting fixture. The method includes adjusting, by one or more control devices of the dimmer switch, the dimming control signal to sweep a dimming range of the one or more dimmable light sources. The method further includes obtaining, by the one or more control devices, data from a power metering circuit of the dimmer switch while adjusting the dimming control signal. In addition, the method includes determining the low-end trim setpoint for the dimming control signal based, at least in part, on the data. The method further includes adjusting a range of the dimming control signal based, at least in part, on the low-end trim setpoint.

Yet another example aspect of the present disclosure is directed to a dimmer switch. The dimmer switch includes a dimmer circuit configured to output a dimming control signal to control at least a first dimmable light source of a lighting fixture and a second dimmable light source of the lighting fixture. The dimmer switch further includes a power metering circuit configured to monitor power consumption of the first dimmable light source and the second dimmable light source. In addition, the dimmer switch includes one or more control devices configured to perform operations. The operations can include performing a test operation to determine a low-end trim setpoint for the dimming control signal. The operations can further include adjusting a range of the dimming control signal based, at least in part, on the low-end trim setpoint.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
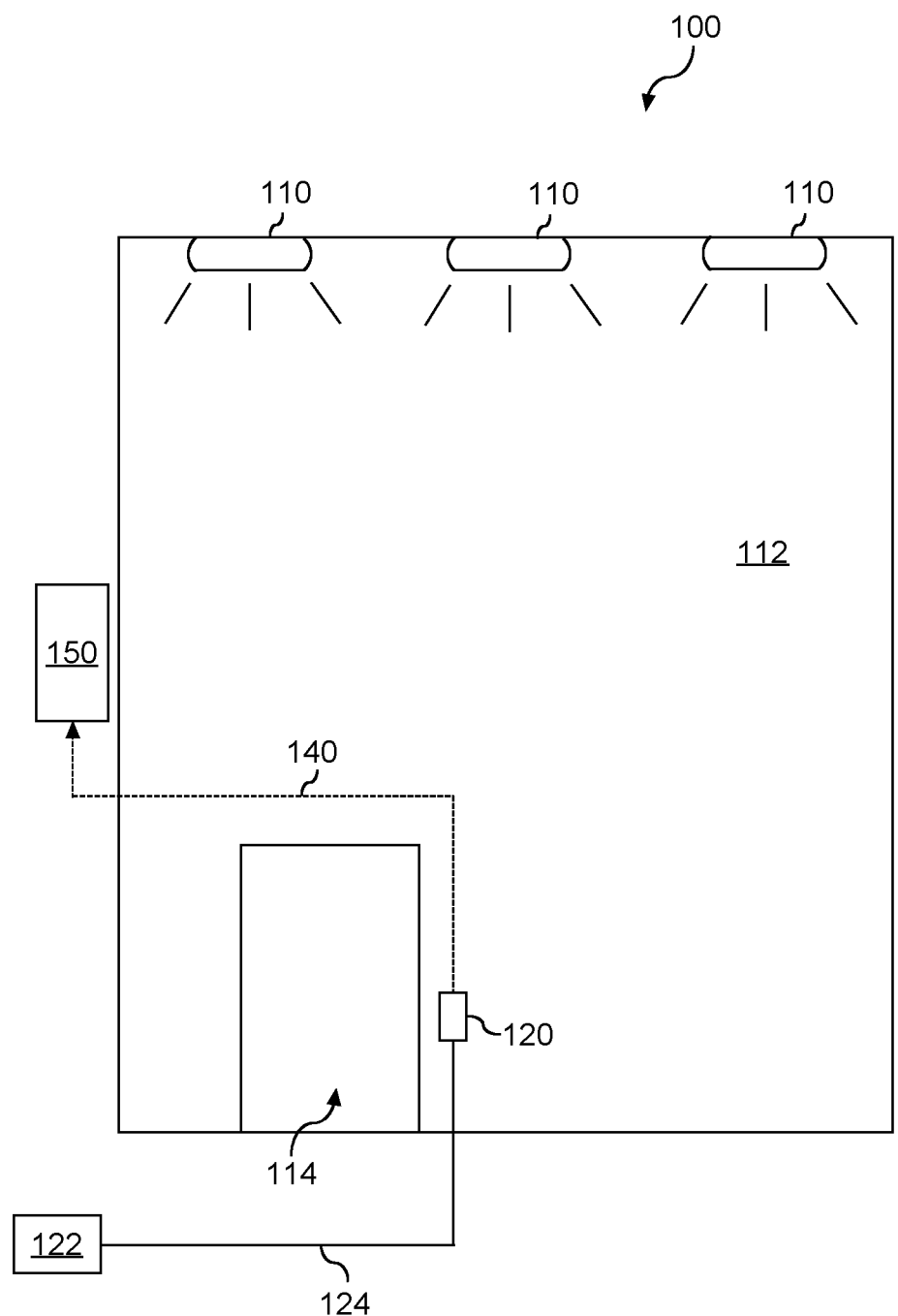
FIG. 1 depicts a schematic of a lighting system according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to a dimmer switch configured to control operation of a dimmable light source (e.g., LED light source, incandescent light source, etc.) of a lighting fixture. For instance, the dimmer switch can include a dimmer circuit configured to output a dimming control signal to control the intensity (e.g., brightness) of the dimmable light source. The dimmer switch can include a power metering circuit coupled to one or more conductors (e.g., wires) coupling the dimmer switch to a power source (e.g., AC mains power supply) configured to provide electrical power to the dimmable light source. The power metering circuit can include one or more sensors (e.g., voltage sensors and/or current sensors) configured to monitor power consumption of the dimmable light source. For instance, the one or more sensors can monitor an electrical signal (e.g., power signal) associated with powering the dimmable light source.

The dimmer switch can include one or more control devices configured to perform a test operation to determine a low-end trim setpoint for the dimming control signal the dimmer circuit outputs to control the intensity of the dimmable light source. For instance, as part of the test operation, the one or more control devices can be configured to adjust the dimming control signal to sweep a dimming range of the dimmable light source. According to example aspects of the present disclosure, the dimming range can be adjusted to provide a desired dimming range for functional operations of the dimmable light source.

In some implementations, adjusting the dimming control signal can include increasing a voltage associated with the dimming control signal to increase the intensity (e.g., brightness) of the dimmable light source. In this manner, the one or more control devices can sweep the dimming range of the dimmable light source. As will be discussed below, the one or more control devices can be configured to obtain data from the power metering circuit while adjusting the dimming control signal.

In some implementations, the data obtained while adjusting the dimming control signal can be indicative of power consumption of the dimmable light source. For instance, the data can be indicative of a power signal associated with powering the dimmable light source. More specifically, the data can be indicative of one or more parameters of the power signal. In some implementations, the one or more parameters can include a magnitude of an electrical current associated with the power signal. Alternatively or additionally, the one or more parameters can include a phase angle associated with the electrical current. As will be discussed below in more detail, the one or more control devices can be configured to determine the low-end trim setpoint for the dimming control signal based, at least in part, on the data indicative of power consumption of the dimmable light source.

The electrical current associated with the power signal can be a function of the dimming range of the dimmable light source. In some implementations, the one or more control devices can be configured to determine the low-end trim setpoint for the dimming control signal based, at least in part, on one or more derivatives of the electrical current with respect to the dimming range. For instance, the one or more control devices can be configured to determine a first derivative of the electrical current with respect to the dimming range. Alternatively or additionally, the one or more control devices can be further configured to determine a second derivative of the electrical current with respect to the dimming range. In this manner, the one or more control devices can be configured to determine the low-end trim setpoint for the dimming control signal based, at least in part, on one or more local maximums or near (e.g., within 10%) local maximums associated with the one or more derivative of the electrical current.

The one or more control devices can be further configured to adjust a range of the dimming control signal based, at least in part, on the low-end trim setpoint determined while performing the test operation. For instance, the one or more control devices can be configured to adjust the range of the dimming control signal based on the low-end trim setpoint to remove portions of the range that are below the low-end trim setpoint. In some implementations, the dimmable light source can emit a visible flicker when dimmed to the portions of the range that are below the low-end trim setpoint. In this manner, the low-end trim setpoint can be determined to remove the portion of the range at which the dimmable light source emits a visible flicker.

In some implementations, the one or more control devices can receive user-input subsequent to adjusting the range of the dimming control signal based on the low-end trim setpoint. The user-input can be indicative of a change to the low-end trim setpoint. In some implementations, the user-input can be received via one or more input devices of the dimmer switch. Alternatively, the user-input can be received from a user device (e.g., smartphone, tablet, laptop, wearable computing device, etc.) that is communicatively coupled with the dimmer switch. The one or more control devices of the dimmer switch can be configured to adjust the range of the dimming control signal based on the user-input. In this manner, the range of the dimming control signal can be programmed according to preferences of an end-user (e.g., homeowner).

The dimmer switch of the present disclosure provides numerous technical benefits. For instance, the dimmer switch can include a power metering circuit configured to obtain data indicative of power consumption of a dimmable light source. As discussed above, the data indicative of power consumption can be used by one or more control devices of the dimmer switch to determine a low-end trim setpoint for a dimming control signal the dimmer switch outputs to control the intensity (e.g., brightness) of a dimmable light source. In this manner, the dimmer switch can program the low-end trim setpoint for the dimming control signal without requiring user-input. Accordingly, instances in which a user adjusts the dimming control signal such that the dimmable light source emits a visible flicker can be reduced or eliminated.

As used herein, the use of the term "about" in conjunction with a numerical value is intended to refer to within 20% of the stated amount. Also, use of the term "obtaining" or "obtain" can include receiving, determining, calculating, accessing, reading or otherwise obtaining data. As used herein, use of the term "low-end trim setpoint" is intended to refer to a setpoint at which the dimmable light source is activated (e.g., turned on) without emitting a visible flicker.

Referring now to the Figures, FIG. 1 depicts a lighting system 100 according to example embodiments of the present disclosure. The lighting system 100 includes one or more lighting fixtures 110 (e.g., luminaires) operable to provide illumination for a space 112 (e.g., a room). The lighting system 100 can include a dimmer switch 120. The dimmer switch 120 can be arranged near an entrance 114 into the space 112. It should be appreciated, however, that the dimmer switch 120 can be arranged at any suitable location within the space 112.

In some implementations the dimmer switch 120 can be coupled to an electrical panel 122 including one or more circuit breakers. More specifically, the dimmer switch 120 can be coupled to the electrical panel 122 via one or more conductors 124. In some implementations, the electrical panel 122 can be coupled to a power source (e.g., AC mains). In this manner, electrical power can be provided from the power source to the dimmer switch 120 via the electrical panel 122. As will be discussed below in more detail, the dimmer switch 120 can be used to control (e.g., dim or brighten) the intensity of light emitted by a dimmable light source of the one or more lighting fixtures 110.

In some implementations, the dimmer switch 120 can be configured to communicate with other devices 150 (e.g., smartphones, tablets, laptops, etc.) over a communication link 140 via one or more networks. In this manner, a user can interact remotely with the dimmer switch 120 by communicating one or more light control commands over the communication link 140. For example, the user can manipulate one or more input devices associated with the other devices 150 to cause the other devices 150 to communicate one or more light control commands over the communication link 140 to the dimmer switch 120. More specifically, the one or more light control commands can cause the dimmer switch 120 to adjust (e.g., dim or brighten) the intensity of light emitted by the dimmable light source of the one or more lighting fixtures 110.

Figure 2:
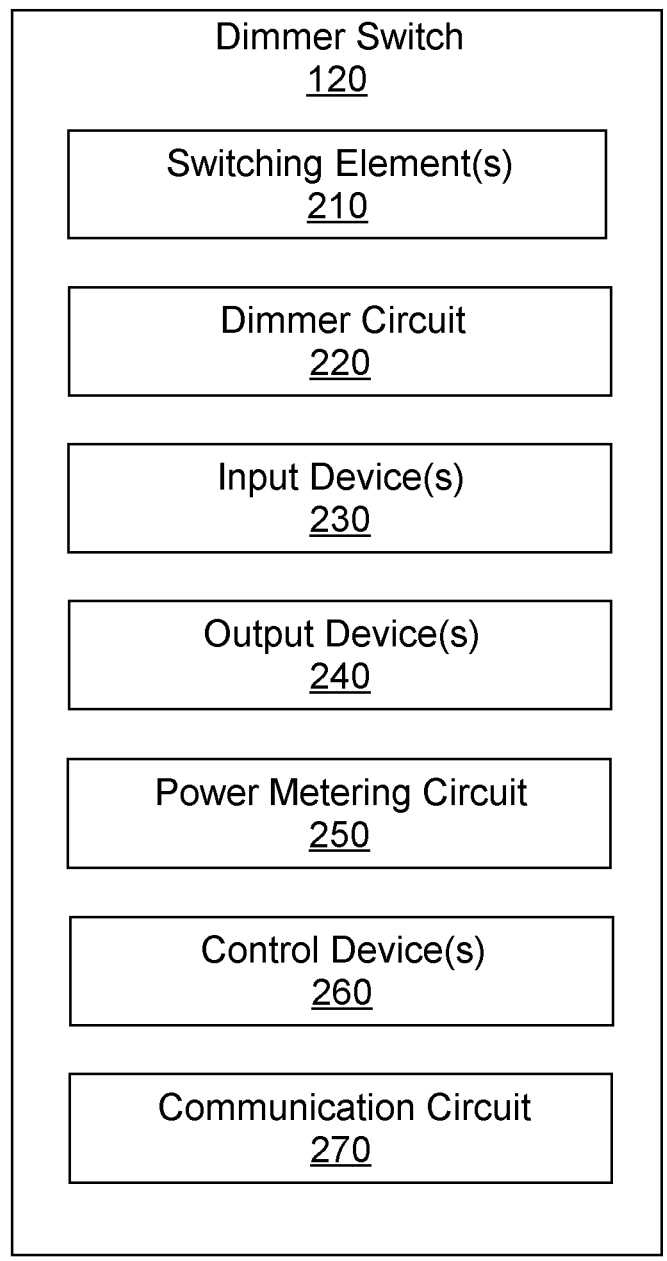
FIG. 2 depicts a block diagram of a dimmer switch of the lighting system according to example embodiments of the present disclosure.

FIG. 2 illustrates suitable components of the dimmer switch 120 according to example embodiments of the present disclosure. In some implementations, the dimmer switch 120 can include one or more switching elements 210 configured to selectively couple one or more dimmable light sources to a power source (e.g., AC mains). For example, the one or more switching elements 210 can be configurable in at least a first state and a second state. When the one or more switching elements 210 are configured in the first state, power is delivered from the power source to the one or more dimmable light sources of the one or more lighting fixtures 110 (FIG. 1). In contrast, power is not delivered from the power source to the one or more dimmable light sources when the one or more switching elements 210 are configured in the second state.

It should be appreciated that the one or more switching elements 210 can include any suitable device configured to control power delivery to the load. For instance, in some implementations, the one or more switching elements 210 can include one or more contactors. Alternatively, the one or more switching element 210 can include one or more transistors, one or more silicon controlled rectifier (SCR), one or more TRIACs, or any other suitable device configured to control power delivery to the load (e.g., lighting fixture).

The dimmer switch 120 can include a dimmer circuit 220. The dimmer circuit 220 can include associated electronic circuitry that can be used to control the intensity (e.g., brightness) of light emitted by the one or more dimmable light sources. It should be appreciated that the dimmer circuit 220 can be used to control the intensity of any suitable dimmable light source. For instance, in some implementations, the dimmer circuit 220 can be configured to control the intensity of dimmable incandescent light sources. In alternative implementations, the dimmer circuit 220 can be configured to control the intensity of dimmable light emitting diode (LED) light sources.

As shown, the dimmer switch 120 can include one or more input devices 230. In some implementations, the one or more input devices 230 can be manipulated (e.g., touched, pressed, pulled, moved, etc.) to control operation of the one or more switching elements 210. For instance, the one or more input devices 230 can be manipulated to activate (e.g., turn on) and deactivate (e.g., turn off) the one or more dimmable light sources. Alternatively or additionally, the one or more input devices 230 can be manipulated to adjust the intensity (e.g. brightness) of light emitted by the one or more dimmable light sources. Example input devices 230 can include, without limitation, a slider, a press-button, a rocker switch, a paddle switch, or a rocker switch. It should be appreciated, however, that the one or more input devices 230 can include any suitable type of input device configured to control power delivery to the one or more dimmable light sources and/or adjust the intensity of light emitted by the one or more dimmable light sources.

In some implementations, the dimmer switch 120 can include one or more output devices 240. For instance, the one or more output devices 240 can include one or more speakers configured to emit audible noise. Alternatively or additionally, the one or more output devices 240 can include one or more indicator lights (e.g., LED indicator lights).

As shown, the dimmer switch 120 can include a power metering circuit 250. The power metering circuit 250 can be configured to detect (e.g., measure) power consumption of the one or more dimmable light sources coupled to the power source (e.g., AC mains) via the one or more switching elements 210. It should be appreciated that the power metering circuit 250 can include any suitable electrical components. For instance, in some implementations, the power metering circuit 250 can include one or more voltage sensors and/or one or more current sensors.

Figure 3:
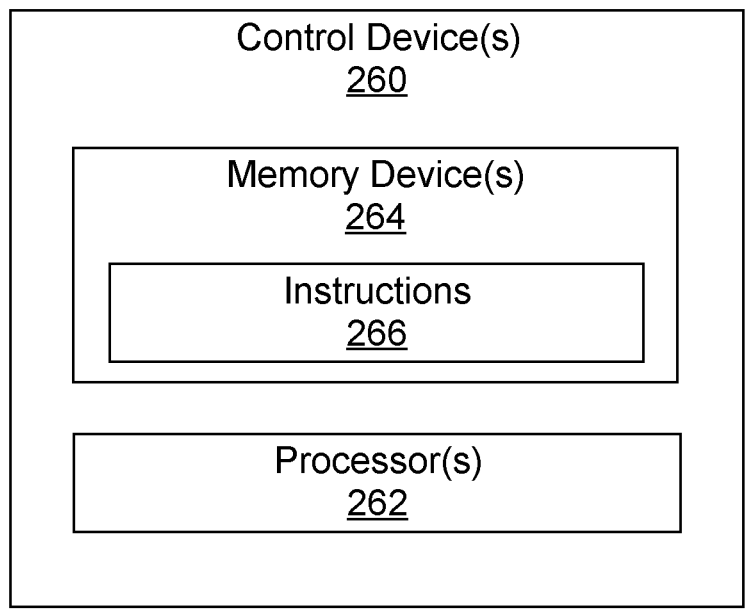
FIG. 3 depicts a block diagram of a control device according to example embodiments of the present disclosure.

The dimmer switch 120 can include one or more control devices 260. FIG. 3 illustrates one embodiment of suitable components of the control device(s) 260. As shown, the control device(s) 260 can include one or more processors 262 configured to perform a variety of computer-implemented functions (e.g., performing the methods, steps, calculations and the like disclosed herein). As used herein, the term "processor" refers not only to integrated circuits referred to in the art as being included in a computer, but also refers to a controller, microcontroller, a microcomputer, a programmable logic controller (PLC), an application specific integrated circuit (ASIC), a Field Programmable Gate Array (FPGA), and other programmable circuits.

As shown, the control device(s) 260 can include a memory device 264. Examples of the memory device 264 can include computer-readable media including, but not limited to, non-transitory computer-readable media, such as RAM, ROM, hard drives, flash drives, or other suitable memory devices. The memory device 264 can store information accessible by the processor(s) 262, including computer-readable instructions 266 that can be executed by the processor(s) 262. The computer-readable instructions 266 can be any set of instructions that, when executed by the processor(s) 262, cause the processor(s) 262 to perform operations. The computer-readable instructions 266 can be software written in any suitable programming language or can be implemented in hardware.

In some implementations, the computer-readable instructions 266 can be executed by the processor(s) 262 to perform operations, such as determining a low-end trim setpoint for the dimming control signal the dimmer circuit 220 outputs to control the intensity of light emitted by the one or more dimmable light source. For instance, the operations can include, as will be discussed below in more detail, performing a test operation to determine the low-end trim setpoint for the dimming control signal.

Referring again to FIG. 2, the dimmer switch 120 can include a communication circuit 270. The communication circuit 270 can include associated electronic circuitry that can be used to communicatively couple the control device(s) 260 with other devices, such as control device(s) 260 associated with a user device (e.g., smartphone, tablet, laptop, wearable computing device, etc.) or other dimmer switches. In some implementations, the communication circuit 270 can allow the control device(s) 260 to communicate directly with the user devices and/or control device(s) 260 associated with other dimmer switches. In other implementations, the communication circuit 270 can provide for communication with the users devices and/or control device(s) 260 associated with other dimmer switches over a network.

The network can be any suitable type of network, such as a Power-Over-Ethernet (POE) network, a local area network (e.g., intranet), a wide area network (e.g., internet), a low power wireless network (e.g., Bluetooth Low Energy (BLE), Zigbee, etc.), or some combination thereof and can include any number of wired or wireless links. In general, communication over the network can be implemented via any type of wired or wireless connection, using a wide variety of communication protocols, encodings or formats, and/or protection schemes.

Example communication technologies used in accordance with example aspects of the present disclosure can include, for instance, Bluetooth low energy, Bluetooth mesh networking, near-field communication, Thread, TLS (Transport Layer Security), Wi-Fi (e.g., IEEE, 802.11), Wi-Fi Direct (for peer-to-peer communication), Z-Wave, Zigbee, Halow, cellular communication, LTE, low-power wide area networking, VSAT, Ethernet, MoCA (Multimedia over Coax Alliance), PLC (Power-line communication), DLT (digital line transmission), Power over Ethernet, etc. Other suitable wired and/or wireless communication technologies can be used without deviating from the scope of the present disclosure.

Figure 4:
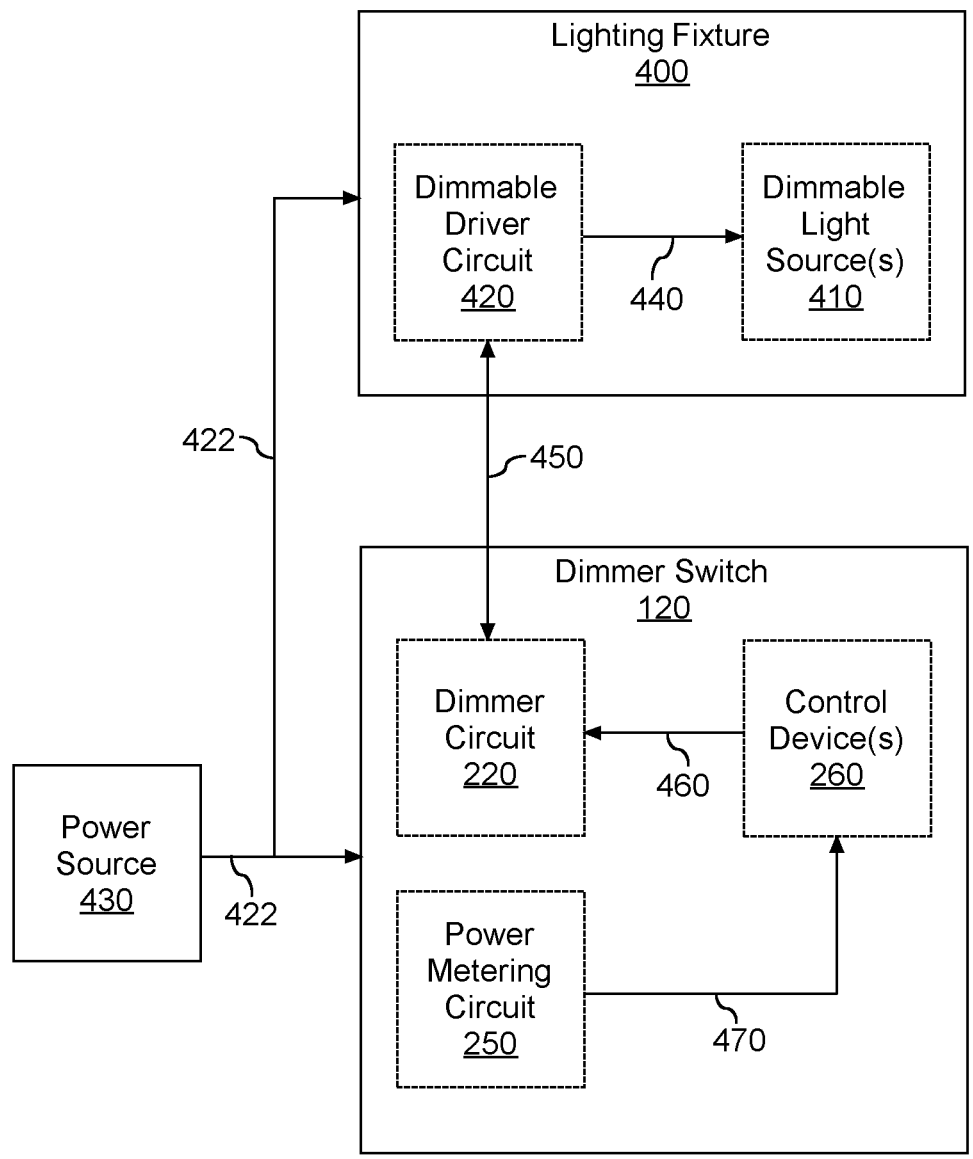
FIG. 4 depicts an example lighting fixture used in conjunction with a dimmer switch according to example embodiments of the present disclosure.

Referring now to FIG. 4, the dimmer switch 120 can be used to control operation of an example lighting fixture 400. As shown, the lighting fixture 400 includes one or more dimmable light sources 410. For instance, the one or more dimmable light sources 410 can include one or more LED devices. The lighting fixture 400 can further include a dimmable driver circuit 420. The dimmable driver circuit 420 can be configured to receive a power signal 422, such as an input AC power signal or a DC power signal, from a power source 430 (e.g., AC mains). In some implementations, the dimmable driver circuit 420 can be selectively coupled to the power source 430 via the one or more switching elements 210 (FIG. 2) of the dimmer switch 120. The dimmable driver circuit 420 can be further configured to convert the input power to a suitable driver current 440 for powering the one or more dimmable light sources 410 of the lighting fixture 400.

The dimmable driver circuit 420 can include various components, such as switching elements (e.g. transistors) that are controlled to provide the suitable driver current 440. For instance, in some implementations, the dimmable driver circuit 420 can include one or more transistors. Gate timing commands can be provided to the one or more transistors to convert the input power to a suitable driver current 440 using pulse width modulation techniques. In alternative implementations, the dimmable driver circuit 420 can be a direct drive AC circuit with full bridge rectification wherein the driver current 440 is a constant Irms current.

As shown, the dimmable driver circuit 420 can receive a dimming control signal 450 from the dimmer circuit 220 of the dimmer switch 120. In some implementations, the dimming control signal 450 can be a 0V to 10V signal. As used herein, a 0V to 10V dimming control signal can vary from, for instance, 1V to 9V, 1V to 10V, 2V to 8V, 2V to 9V, 2V, to 10V, 1V to 11V, or other suitable range between about 0V and about 10V. Other suitable protocols can be used for the dimming control signal 450. For instance, the dimming control signal 450 can be a digital addressable lighting interface (DALI) dimming control signal, digital multiplex (DMX) dimming control signal, or other dimming control signal.

The dimmable driver circuit 420 can be configured to control the driver current 440 based, at least in part, on the dimming control signal 450. For example, reducing the dimming control signal 450 by about 50 percent can result in a corresponding reduction in the driver current 440 by about 50 percent. The reduction of the driver current 440 for supply to the one or more dimmable light sources 410 can result in the radiant flux of the one or more dimmable light sources 410 being decreased.

In some implementations, the power metering circuit 250 of the dimmer switch 120 can be coupled to one or more conductors (e.g., wires) coupled between the power source 430 and the lighting fixture 400. In this manner, the power metering circuit 250 can be configured to detect (e.g., measure) power consumption of the one or more dimmable light sources 410. For example, the data can be indicative of the power signal 422 associated with powering the one or more dimmable light sources 410. In some implementations, the data can be indicative of one or more parameters (e.g., current, phase angle, etc.) of the power signal 422. As will be discussed below in more detail, the one or more control devices 260 of the dimmer switch 120 can be configured to implement a test operation to determine a low-end trim setpoint for the dimming control signal 450 based, at least in part, on the data obtained from the power metering circuit 250.

As part of the test operation, the one or more control devices 260 can provide one or more control signals 460 to the dimmer circuit 220 to adjust the dimming control signal 450. In this manner, the intensity (e.g., brightness) of light emitted by the one or more dimmable light sources 410 can be reduced (e.g., dimmed) or increased (e.g., brightened). In some implementations, the one or more control devices 260 can be configured to increase a voltage associated with the dimming control signal 450 to sweep a dimming range of the one or more dimmable light sources 410.

The one or more control devices 260 can be further configured to obtain data 470 from the power metering circuit 250 while adjusting the dimming control signal 450. The data 470 obtained from the power metering circuit 250 can be indicative of power consumption of the one or more dimmable light sources 410. For instance, the data 470 can be indicative of the power signal 422 associated with powering the one or more dimmable light sources 410. More specifically, the data 470 can be indicative of one or more parameters (e.g., current, phase angle) of the power signal 422. As will be discussed below in more detail, the one or more control devices 260 can be configured to determine a low-end trim setpoint for the dimming control signal 450 based, at least in part, on the data 470 obtained from the power metering circuit 250.

Figure 5:
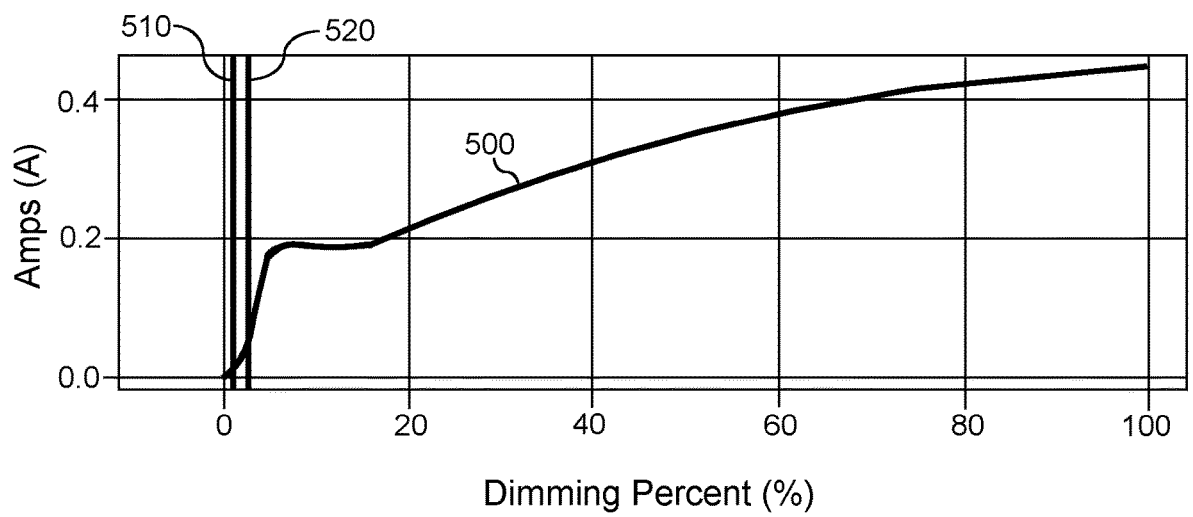
FIG. 5 depicts a graphical representation of a measured current of a power signal associated with powering one or more dimmable light sources according to example embodiments of the present disclosure.

Referring now to FIG. 5, a graphical representation of a measured current of the power signal 422 (FIG. 4) associated with powering the one or more dimmable light sources 410 (FIG. 4) is provided according to example embodiments of the present disclosure. As shown, the graph plots a dimming range (e.g., 0% to 100%) of the one or more dimmable light sources 410 along the horizontal axis and the measured current of the power signal 422 along the vertical axis. Curve 500 depicts the measured current of the power signal as a function of the dimming range. Line 510 represents a low-end trim setpoint for the dimming control signal 450 (FIG. 4) as determined by a user observing light emitted by the one or more dimmable light sources 410. Line 520 represents a low-end trim setpoint for the dimming control signal 450 as determined by the one or more control devices 260 (FIG. 4) of the dimmer switch 120 (FIG. 4). As illustrated, the low-end trim setpoint (e.g., line 520) determined by the one or more control devices 260 removes a portion (e.g., space between line 510 and line 520) of the range of the dimming control signal 450 at which the one or more dimmable light sources 410 emit light having a visible flicker. In this manner, the one or more control devices 260 can more accurately determine the low-end trim setpoint for the dimming control signal 450.

Figure 6:
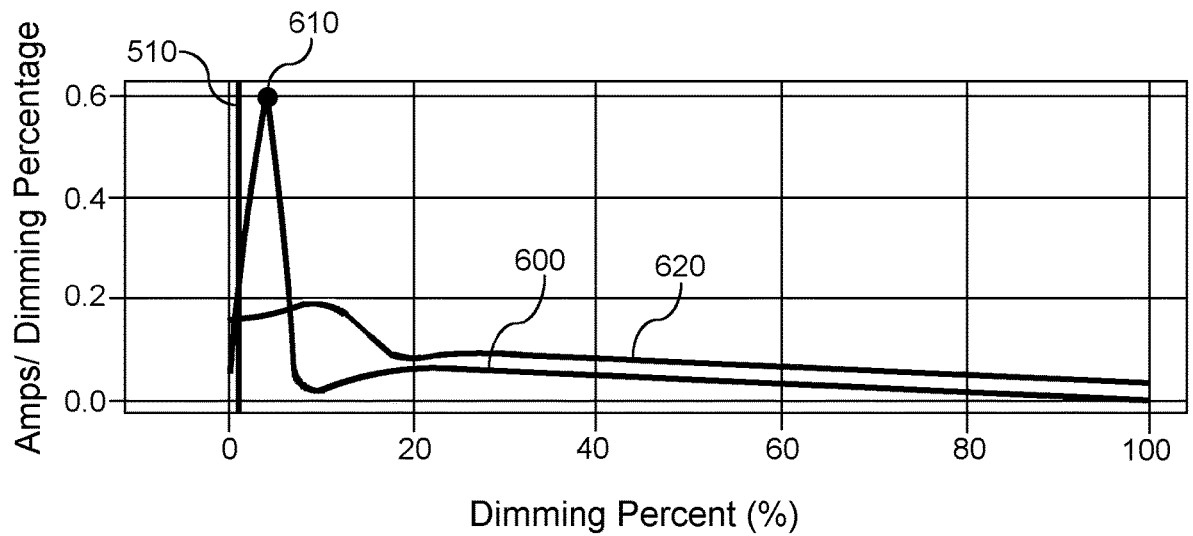
FIG. 6 depicts a graphical representation of a first derivative of the measured current of FIG. 5 according to example embodiments of the present disclosure.

FIG. 6 depicts a graphical representation of a first derivative of the measured current of the power signal 422 (FIG. 4) according to example embodiments of the present disclosure. For instance, curve 600 corresponds to the first derivative of the curve 500 depicted in FIG. 5 and includes a local maximum 610 as shown. Curve 620 corresponds to a threshold the one or more control devices 260 (FIG. 4) compare curve 600 against to determine the low-end trim setpoint for the dimming control signal 450 (FIG. 4). For example, the one or more control devices 260 can be configured to ignore any point of curve 600 that is less than a corresponding point of curve 620. In this manner, the one or more control devices 260 can be configured to determine the low-end trim setpoint for the dimming control signal 450 based, at least in part, on points of curve 600 that are greater than corresponding points of curve 620.

Figure 7:
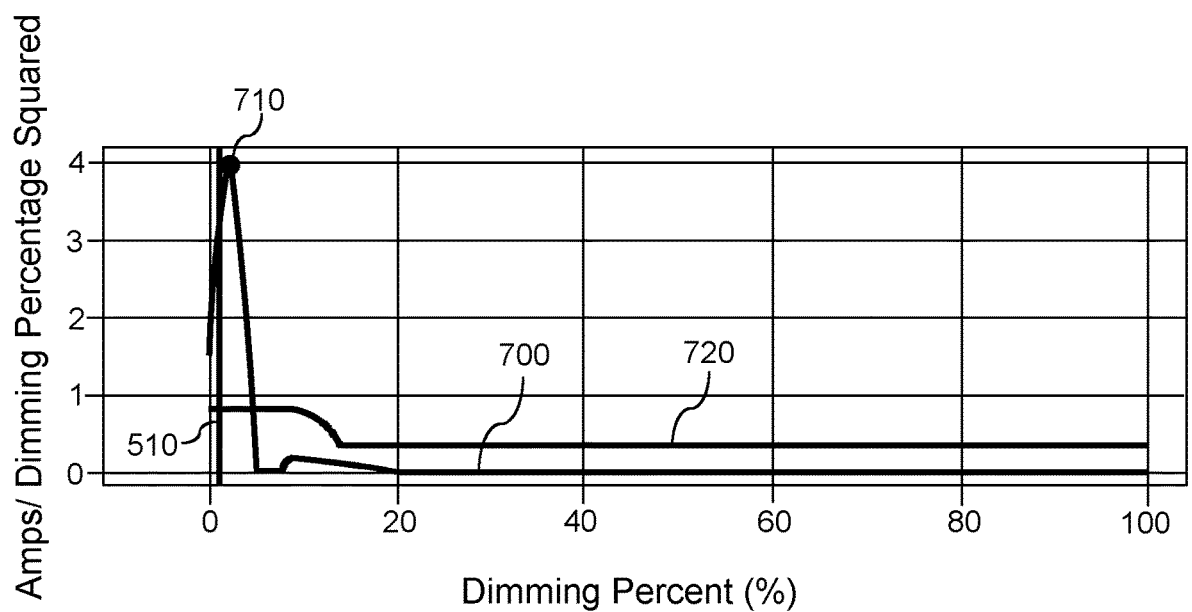
FIG. 7 depicts a graphical representation of a second derivative of the measured current of FIG. 5 according to example embodiments of the present disclosure.

FIG. 7 depicts a graphical representation of a second derivative of the measured current of the power signal 422 (FIG. 4) according to example embodiments of the present disclosure. For instance, curve 700 corresponds to the second derivative of the curve 500 depicted in FIG. 5 and includes a local maximum 710 as shown. Curve 720 corresponds to a threshold the one or more control devices compare curve 700 against to determine the low-end trim setpoint for the dimming control signal 450 (FIG. 4). For example, the one or more control devices 260 can be configured to ignore any point of curve 700 that is less than a corresponding point of curve 720. In this manner, the one or more control devices 260 can be configured to determine the low-end trim setpoint for the dimming control signal 450 (FIG. 4) based, at least in part, on points of curve 700 that are greater than corresponding points of curve 720.

Figure 8:
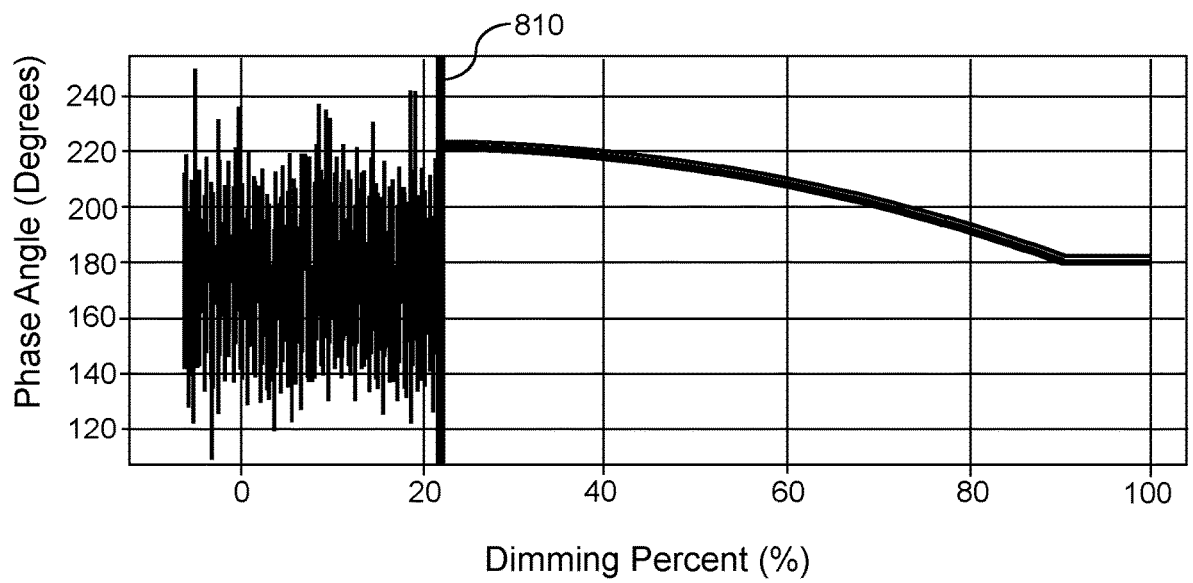
FIG. 8 depicts a graphical representation of a phase angle of a power signal associated with powering one or more dimmable light sources according to example embodiments of the present disclosure.

It should be appreciated, however, that the data 470 (FIG. 4) the one or more control devices 260 obtain from the power metering circuit 250 while adjusting the dimming control signal 450 can include other parameters associated with the power signal 422. For instance, the data 470 can indicate a phase angle of the power signal 422. FIG. 8 depicts a graphical representation of a phase angle of the power signal 422 (FIG. 4) according to example embodiments of the present disclosure. As shown, the graph plots a dimming range (e.g., 0% to 100%) of the one or more dimmable light sources 410 along the horizontal axis and a measured phase angle of the power signal 422 along the vertical axis.

In some implementations, the one or more control devices (FIG. 4) can be configured to determine the low-end trim setpoint (e.g., line 810) of the dimming control signal 450 (FIG. 4) based, at least in part, on data indicative of the phase angle of the power signal 422. As shown, the low-end trim setpoint can correspond to a dimming percentage at which the phase angle of the power signal 422 transitions from being unstable to stable. It should be appreciated that the phase angle of the power signal 422 becomes unstable (e.g., portion of power signal to the left of line 810) when light emitted by the one or more dimmable light sources 410 has a visible flicker. As such, the low-end trim setpoint for the dimming control signal 450 determined by the one or more control devices 260 can correspond to a dimming percentage at which the phase angle of the power signal transitions from being unstable to stable.

In some implementations, the one or more control devices 260 (FIG. 4) can be further configured to adjust a range of the dimming control signal 450 (FIG. 4) based, at least in part, on the low-end trim setpoint (e.g., line 510 of FIGS. 5-7 or line 810 of FIG. 8). For instance, the one or more control devices 260 can adjust the range of the dimming control signal 450 to remove portion of the range below (e.g., to the left of line 510 in FIGS. 5-7 or line 810 of FIG. 8) the low-end trim setpoint. In this manner, the portion of the dimming range at which light emitted by the one or more dimmable light sources 410 has a visible flicker can be removed from the range of the dimming control signal 450.

Figure 9:
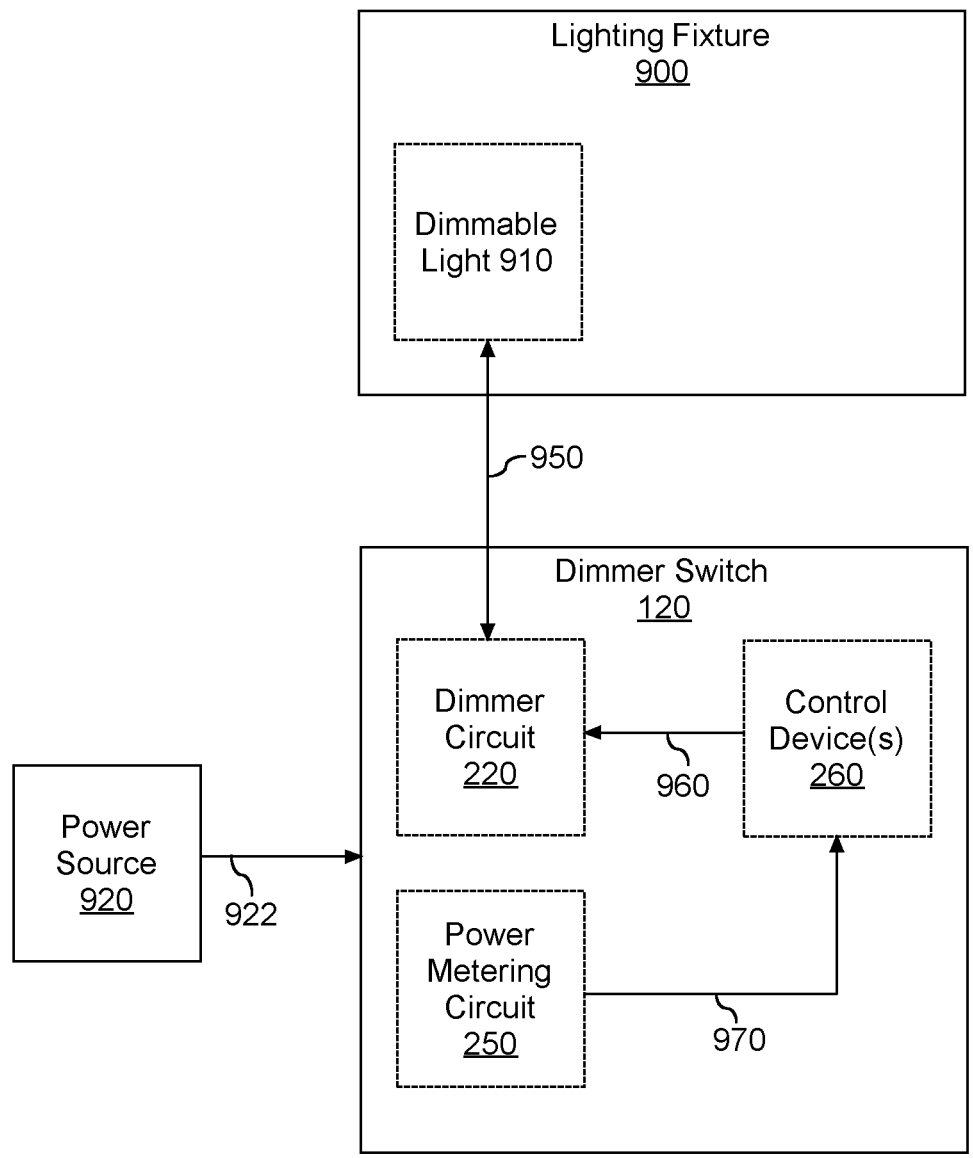
FIG. 9 depicts another example lighting fixture used in conjunction with a dimmer switch according to example embodiments of the present disclosure.

Aspects of the present disclosure are discussed with reference to the dimmer switch 120 being used to control the intensity of light emitted by one or more dimmable LED light sources coupled to a dimmable driver circuit. It should be appreciated, however, that dimmer switch 120 of the present disclosure can be used to control the intensity of light emitted by any suitable light source. For instance, as shown in FIG. 9, the dimmer switch 120 can be used to control the intensity (e.g., brightness) of light emitted by one or more dimmable incandescent light sources 910 of a lighting fixture 900. As shown, the dimmer switch 120 can be coupled between the lighting fixture 900 and a power source 920, such as an AC mains power source. In this manner, the dimmer switch 120 can adjust a power signal 922 (e.g., from the power source 920) associated with powering the one or more dimmable incandescent light sources 910.

In some implementations, the power metering circuit 250 of the dimmer switch 120 can be coupled to one or more conductors (e.g., wires) coupled between the power source 920 and the lighting fixture 900. In this manner, the power metering circuit 250 can be configured to detect (e.g., measure) power consumption of the one or more dimmable incandescent light sources 910. For example, the data can be indicative of a power signal associated with powering the one or more dimmable incandescent light sources 910. In some implementations, the data can be indicative of one or more parameters (e.g., current, phase angle, etc.) of the power signal 922.

The one or more control devices 260 can provide one or more control signals 960 to the dimmer circuit 220 to adjust a dimming control signal 950 the dimmer circuit 220 provides to the one or more dimmable incandescent light sources 910. It should be appreciated that the dimming control signal can be an adjusted power signal. For instance, one or more parameters (e.g., current, voltage, etc.) of the dimming control signal 950 can be adjusted relative to one or more corresponding parameters of the power signal 922.

The one or more control devices 260 can be further configured to obtain data 970 from the power metering circuit 250 while adjusting the dimming control signal 950. The data 970 obtained from the power metering circuit 250 can be indicative of power consumption of the one or more dimmable incandescent light sources 910 while adjusting the dimming control signal 950. For instance, the data 970 can be indicative of the power signal 922 associated with powering the one or more dimmable incandescent light sources 910. More specifically, the data 970 can be indicative of one or more parameters (e.g., current, phase angle) of the power signal 922. Similar to the test operation discussed above, the one or more control devices 260 can be configured to determine a low-end trim setpoint for the dimming control signal 950 based, at least in part, on the data 970 obtained from the power metering circuit 250.

Figure 10:
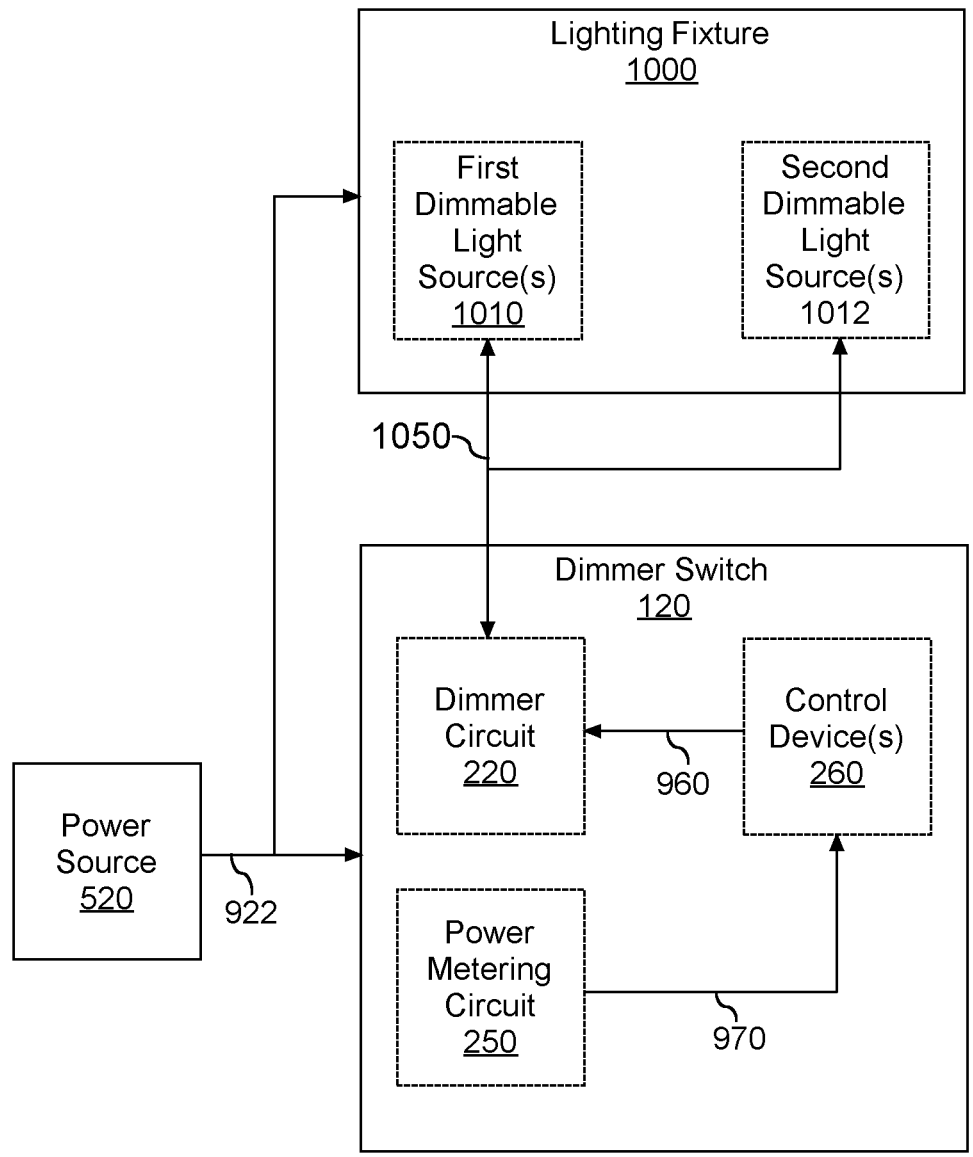
FIG. 10 depicts yet another example lighting fixture used in conjunction with a dimmer switch according to example embodiments of the present disclosure.

Referring now to FIG. 10, the dimmer switch 120 can be used to control operation of a lighting fixture 1000 that includes a plurality of dimmable light sources. As shown, the lighting fixture 1000 can include a first dimmable light source 1010 and a second dimmable light source 1012. It should be appreciated, however that the lighting fixture 1000 can include more than two dimmable light sources. For instance, the lighting fixture 1000 can be a chandelier that includes several (e.g., more than two) dimmable light sources.

In some implementations, the first dimmable light source 1010 may be different than the second dimmable light source 1012. For instance, the first dimmable light source 1010 can be a LED device. Conversely, the second dimmable light source 1012 can be an incandescent light source. The one or more control devices 260 of the dimmer switch 120 can be configured to perform the test operation discussed above to determine a low-end trim setpoint for a dimming control signal 1050 the dimmer circuit 220 provides to both the first dimmable light source 1010 and the second dimmable light source 1012.

In some implementations, the low-end trim setpoint for the dimming control signal 1050 can correspond to an amount of electrical power needed to activate (e.g., turn on) both the first dimmable light source 1010 and the second dimmable light source 1012 without flickering (e.g., emitting light having a visible flicker). For instance, when an amount of power needed to activate the second dimmable light source 1012 without flickering is greater than the amount of the power needed to activate the first dimmable light source 1010 without flickering, the low-end trim setpoint can correspond to the amount of power needed to activate the second dimmable light source 1012. Conversely, when the amount of power needed to activate the first dimmable light source 1010 without flickering is greater than the amount of power needed to activate the second dimmable light source 1012 without flickering, the low-end trim setpoint can correspond to the amount of power needed to activate the first dimmable light source 1010.

In some implementations, the one or more control devices 260 can be configured to determine the low-end trim setpoint for the dimming control signal 1050 whenever one of the first dimmable light source 1010 and the second dimmable light source 1012 is replaced. In alternative implementations, the one or more control devices 260 can be configured to determine the low-end trim setpoint at predetermined intervals of time. For example, the one or more control devices 260 can be configured to determine the low-end trim setpoint once every four hours.

Figure 11:
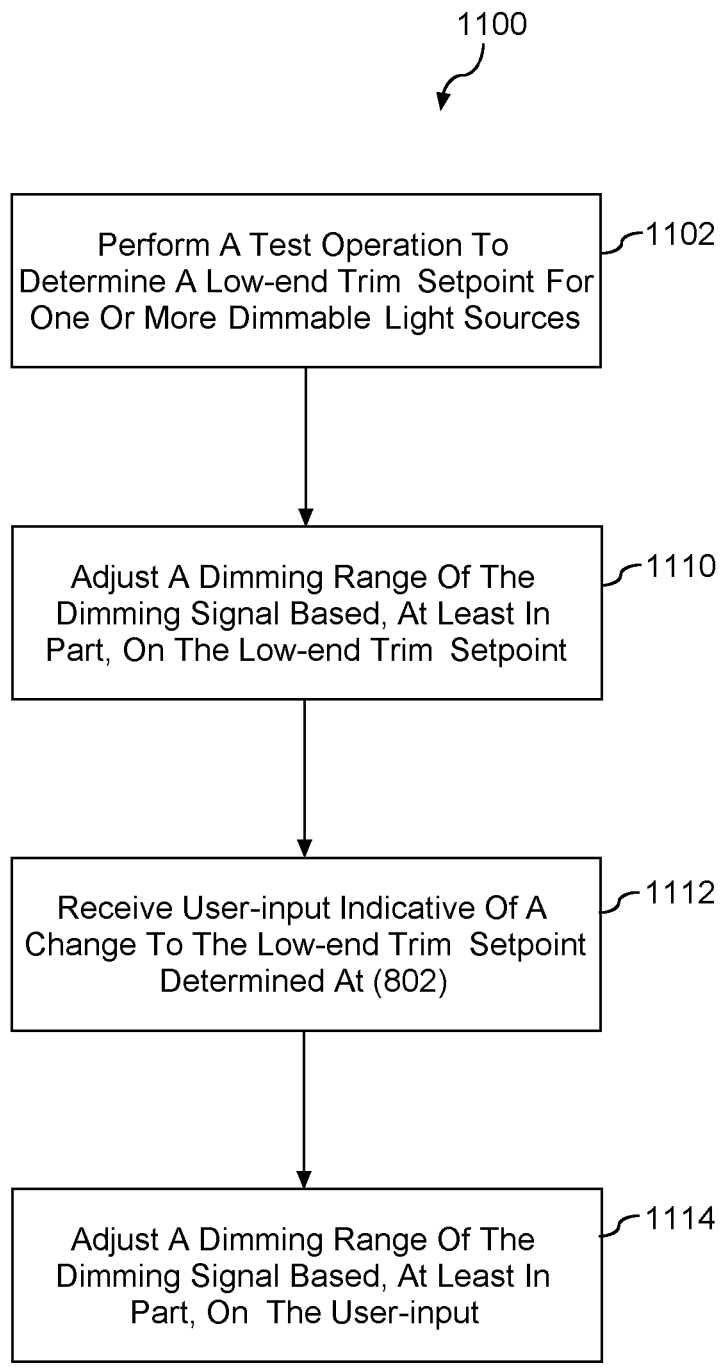
FIG. 11 depicts a flow diagram of a method for determining a low-end trim setpoint for a dimming control signal a dimmer switch outputs to control intensity of a dimmable light source according to example embodiments of the present disclosure.

Referring now to FIG. 11, a flow diagram of a method 1100 for determining a low-end trim setpoint for a dimming control signal a dimmer switch outputs to control one or more dimmable light sources according to example embodiments of the present disclosure. It should be appreciated that the method 1100 can be implemented using the dimmer switch discussed above with reference to FIG. 2. FIG. 11 depicts steps performed in a particular order for purposes of illustration and discussion. Those of ordinary skill in the art, using the disclosures provided herein, will understand that various steps of the method 1100 can be adapted, modified, rearranged, performed simultaneously or modified in various ways without deviating from the scope of the present disclosure.

Figure 12:
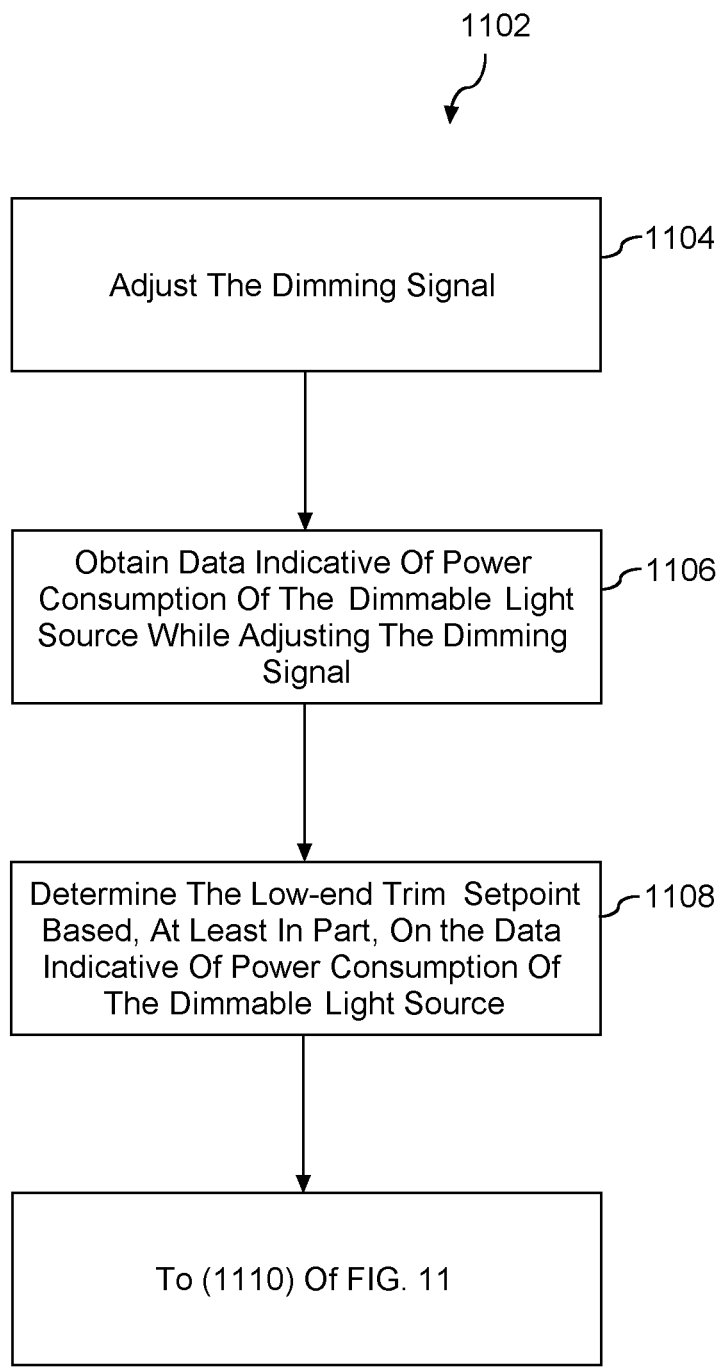
FIG. 12 depicts a flow diagram of a test operation performed as part of the method depicted in FIG. 11 according to example embodiments of the present disclosure.

At (1102), the method 1100 can include performing a test operation to determine the low-end trim setpoint for the dimming control signal. Referring briefly now to FIG. 12, performing the test operation can include, at (1104), adjusting the dimming control signal to sweep a dimming range of the one or more dimmable light sources. In some implementations, adjusting the dimming control signal can include increasing a voltage associated with the dimming control signal to increase the intensity (e.g., brightness) of the light emitted by the dimmable light source. In this manner, the one or more control devices can sweep the dimming range of the one or more dimmable light sources.

At (1106), performing the test operation can include obtaining data indicative of power consumption of the dimmable light source while adjusting the dimming control signal at (1104). In some implementations, the data can be indicative of a power signal associated with powering the dimmable light source. For instance, the data can be indicative of one or more parameters of the power signal. In some implementations, the one or more parameters can include a magnitude of an electrical current associated with the power signal. Alternatively or additionally, the one or more parameters can include a phase angle associated with the power signal.

At (1108), performing the test operation can include determining the low-end trim setpoint for the dimming control signal based, at least in part, on the data obtained at (1106). In some implementations, the one or more control devices can be configured to determine the low-end trim setpoint based, at least in part, on one or more derivatives of the power signal. For instance, the one or more control devices can be configured to determine a first derivative of the power signal with respect to the dimming range of the dimmable light source. Alternatively or additionally, the one or more control devices can be further configured to determine a second derivative of the current signal with respect to the dimming range. In this manner, the one or more control devices can be configured to determine the low-end trim setpoint for the dimming control signal based, at least in part, on one or more local maximums associated with the first derivative and/or second derivative of the power signal.

Referring again to FIG. 11, the method 1100 further includes, at (1110), adjusting a range of the dimming control signal based, at least in part, on the low-end trim setpoint determined while performing the test operation at (1102). For instance, the one or more control devices can be configured to adjust the range of the dimming control signal to remove portions of the range that are below the low-end trim setpoint.

At (1112), the method 1100 includes receiving user-input subsequent to adjusting the range of the dimming control signal at (1110). For instance, the user-input can be indicative of an adjustment (e.g., increase or decrease) to the low-end trim setpoint. In some implementations, the user-input can be received via one or more input devices of the dimmer switch. Alternatively, the user-input can be received from a user device (e.g., smartphone, tablet, etc.) that is communicatively coupled with the dimmer switch. At (1114), the one or more control devices of the dimmer switch can be configured to adjust the range of the dimming control signal based on the user-input. In this manner, the low-end trim setpoint determined during the test operation performed at (1102) can be overridden to accommodate personal preferences of an end-user (e.g., homeowner).

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A dimmer switch, comprising:
   a dimmer circuit configured to output a dimming control signal to control one or more dimmable light sources of a lighting fixture;
   a power metering circuit configured to monitor power consumption of the one or more dimmable light sources; and
   one or more control devices configured to perform operations, the operations comprising:
   adjusting the dimming control signal to sweep a dimming range of the one or more dimmable light sources;
   obtaining data associated with power consumption from the power metering circuit while adjusting the dimming control signal, wherein the data is indicative of a power signal associated with powering the one or more dimmable light sources;
   obtaining one or more derivatives of the power signal;
   determining a low-end trim setpoint for the dimming control signal based, at least in part, on a phase angle of the power signal, the data associated with power consumption, and the one or more derivatives of the power signal; and
   adjusting a range of the dimming control signal based, at least in part, on the low-end trim setpoint.

2. The dimmer switch of claim 1, wherein adjusting the dimming control signal comprises increasing a voltage associated with the dimming control signal.

3. The dimmer switch of claim 1, wherein determining the low-end trim setpoint comprises determining the low-end trim setpoint based, at least in part, on an electrical current of the power signal.

4. The dimmer switch of claim 1, wherein the operations further comprise:
   receiving user-input; and
   adjusting the low-end trim setpoint based, at least in part, on the user-input.

5. A method for determining a low-end trim setpoint for a dimming control signal a dimmer switch outputs to control one or more dimmable light sources of a lighting fixture, the method comprising:
   adjusting, by one or more control devices of the dimmer switch, the dimming control signal to sweep a dimming range of the one or more dimmable light source;
   obtaining, by the one or more control devices, data indicative of a power signal associated with powering the one or more dimmable light sources from a power metering circuit of the dimmer switch while adjusting the dimming control signal;
   obtaining one or more derivatives of the power signal;
   determining the low-end trim setpoint for the dimming control signal based, at least in part, on a phase angle associated with the power signal and the one or more derivatives of the power signal; and
   adjusting a range of the dimming control signal based, at least in part, on the low-end trim setpoint.

6. The method of claim 5, wherein adjusting the dimming control signal comprises increasing a voltage associated with the dimming control signal.

7. The method of claim 5, wherein determining the low-end trim setpoint comprises determining the low-end trim setpoint based, at least in part, on an electrical current associated with the power signal.

8. The method of claim 5, further comprising:
   receiving user-input subsequent to determining the low-end trim setpoint for the dimming control signal; and
   adjusting the low-end trim setpoint based, at least in part, on the user-input.

9. A dimmer switch, comprising:
   a dimmer circuit configured to output a dimming control signal to control at least a first dimmable light source of a lighting fixture and a second dimmable light source of the lighting fixture;
   a power metering circuit configured to monitor power consumption of the first dimmable light source and the second dimmable light source; and
   one or more control devices configured to perform operations, the operations comprising:
   determining, by the one or more control devices, a low-end trim setpoint for the dimming control signal based, at least in part, on data obtained from the power metering circuit; and
   adjusting a range of the dimming control signal based, at least in part, on the low-end trim setpoint;
   wherein when the data indicates an amount of power needed to activate the first dimmable light source is less than an amount of power needed to activate the second dimmable light source, the low-end trim setpoint corresponds to the amount of power needed to activate the second dimmable light source.

10. The dimmer switch of claim 9, the operations further comprising:
    increasing an amount of electrical power the first dimmable light source and the second dimmable light source draw from a power source; and
    obtaining the data from the power metering circuit while increasing the amount of electrical power.

11. The dimmer switch of claim 9, wherein the data is indicative of a power signal associated with powering the one or more dimmable light sources.

12. The dimmer switch of claim 9, wherein:
the first dimmable light source comprises a LED device; and
the second dimmable light source comprises an incandescent light source.

* * * * *